United States Patent
Chen et al.

(10) Patent No.: US 12,324,097 B2
(45) Date of Patent: Jun. 3, 2025

(54) PCB PAD FOR SMT PROCESS

(71) Applicant: DELTA ELECTRONICS, INC., Taoyuan (TW)

(72) Inventors: Heng-Chao Chen, Taoyuan (TW); Chia-Min Ho, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 206 days.

(21) Appl. No.: 17/982,964

(22) Filed: Nov. 8, 2022

(65) Prior Publication Data
US 2024/0064896 A1 Feb. 22, 2024

(30) Foreign Application Priority Data
Aug. 17, 2022 (CN) .......................... 202210989383.4

(51) Int. Cl.
*H05K 1/11* (2006.01)
*H05K 1/18* (2006.01)

(52) U.S. Cl.
CPC ............. *H05K 1/111* (2013.01); *H05K 1/181* (2013.01); *H05K 2201/10318* (2013.01)

(58) Field of Classification Search
CPC ........ H05K 1/111; H05K 1/181; H05K 3/303; H05K 2201/10318
See application file for complete search history.

(56) References Cited

U.S. PATENT DOCUMENTS
2015/0096794 A1    4/2015   Chien et al.

FOREIGN PATENT DOCUMENTS
JP    H04112597 A  *  4/1992
KR    101600514 B1 *  3/2016
TW    200945618 A     11/2009

OTHER PUBLICATIONS

Office Action dated May 12, 2023 of the corresponding Taiwan patent application No. 111130881.
Search Report dated Aug. 11, 2023 of the corresponding European patent application No. 22206714.2.

* cited by examiner

*Primary Examiner* — Nathan Milakovich
(74) *Attorney, Agent, or Firm* — Chun-Ming Shih; HDLS IPR SERVICES

(57) ABSTRACT

A PCB pad for a SMT process is combined on a PCB. The PCB pad includes an insulation body and a metal reflow portion disposed on the insulation body. The metal reflow portion is located on the side of the insulation body adjacent to the PCB. The metal reflow portion is not electrically connected with the PCB. Thus, the PCB pad may support electronic components of the PCB and prevent the electronic components from being damaged by an external pressure.

5 Claims, 7 Drawing Sheets

PCB PAD FOR SMT PROCESS

BACKGROUND OF THE DISCLOSURE

Technical Field

The technical field relates to a supporting pad, and more particularly relates to a printed circuit board (PCB) pad for a surface mount technology (SMT) process.

Description of Related Art

In the manufacturing process of the PCB, it is usually necessary to dispose electronic components such as resistors and capacitors to achieve specific functions. In recent years, electronic components may be fixed on the PCB by SMT process.

Moreover, some PCBs may be disposed with a plurality of PCB pads/bumpers to support the electronic components on the PCB to prevent the electronic components from being pressed. Additionally, the related-art PCB pads/bumpers may be fixed on the PCBs by dispensing or combined with the PCB through adhering by hand after adding adhesive. However, the related-art PCB pads/bumpers fixed by adhesive may not be used in a high-temperature reflow soldering. Thus, the related-art PCB pads/bumpers may not be combined with the PCB by an automated machine during the soldering process.

In view of the above drawbacks, the inventor proposes this disclosure based on his expert knowledge and elaborate researches in order to solve the problems of related art.

SUMMARY OF THE DISCLOSURE

One object of this disclosure is to provide a PCB pad for a SMT process to support the electronic components disposed on the PCB, so that the electronic components may be prevented from damaging by the external force.

In the embodiment of this disclosure, this disclosure is a PCB pad for a SMT process and is combined on a PCB. The PCB pad includes an insulation body and a metal reflow portion disposed on the insulation body. The metal reflow portion is located on a side of the insulation body adjacent to the PCB. The metal reflow portion is not electrically connected with the PCB.

In comparison with the related art, the PCB pad for the SMT process in this disclosure is disposed the metal reflow portion on the insulation body, and the PCB pad is disposed on the PCB by placing the metal reflow portion in a direction close to the PCB. Additionally, the insulation body of the PCB pad has a pick-up plane for vacuum suction by an automatic machine or an automatic arm. Moreover, when the PCB passes the soldering machine, the solder may be attached on the metal reflow portion to solder the PCB pad on the PCB. Accordingly, the PCB pads may be attached to two sides of electronic components, such as surface mount device (SMD) components, for supporting. As a result, the electronic components may be prevented from being damaged by the external pressure.

BRIEF DESCRIPTION OF THE DRAWINGS

The features of the disclosure believed to be novel are set forth with particularity in the appended claims. The disclosure itself, however, may be best understood by reference to the following detailed description of the disclosure, which describes a number of exemplary embodiments of the disclosure, taken in conjunction with the accompanying drawings, in which:

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
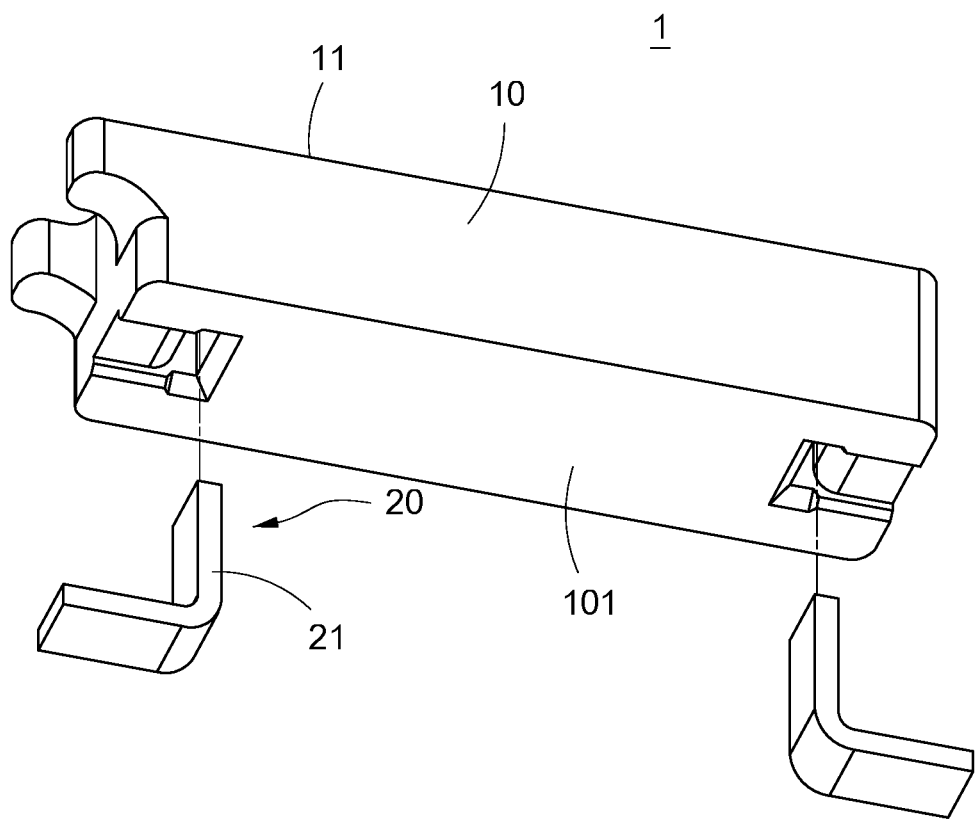
FIG. 1 is a perspective exploded schematic view of the PCB pad for the SMT process in this disclosure.
Figure 2:
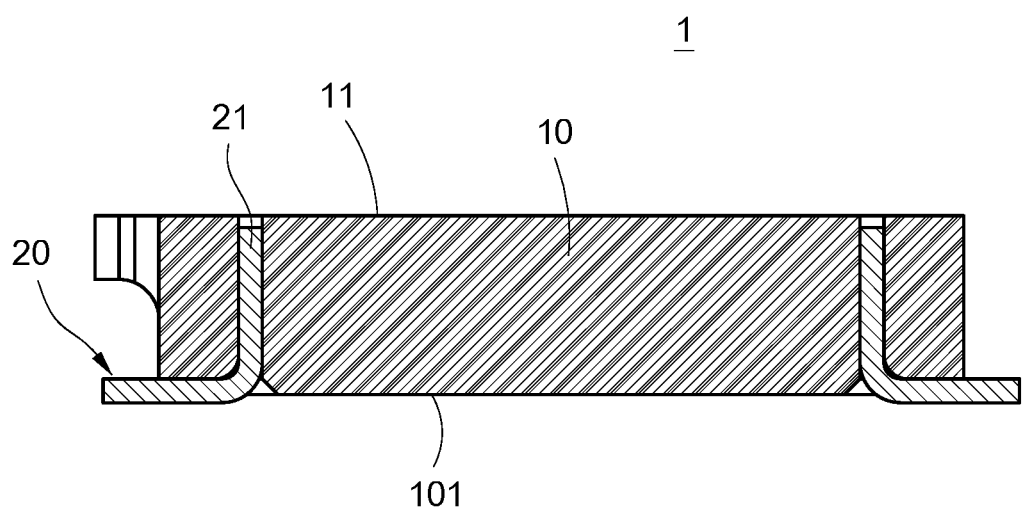
FIG. 2 is a cross-sectional view of the PCB pad for the SMT process in this disclosure.

Please refer to FIG. 1 and FIG. 2, which depict a perspective exploded schematic view and a cross-sectional view of the PCB pad for the SMT process in this disclosure. This disclosure is a PCB pad 1 for a SMT process, the PCB pad 1 includes an insulation body 10 and a metal reflow portion 20 disposed on the insulation body 10. The insulation body 10 has a pick-up plane 11 used for vacuum suction by an automatic machine or an automatic arm.

Moreover, the metal reflow portion 20 includes at least one metal pin 21. The metal pin 21 is inserted in the insulation body 10 and exposed from the bottom 101 of the insulation body 10. Specifically, the metal pin 21 is substantially in an L shape and the number thereof is multiple.

In one embodiment of this disclosure, the insulation body 10 is a cuboid. Additionally, the metal reflow portion 20 includes a pair of metal pins 21 in L-shape. The pair of metal pins 21 are disposed spacedly on two sides of the insulation body 10 opposite to each other.

Figure 3:
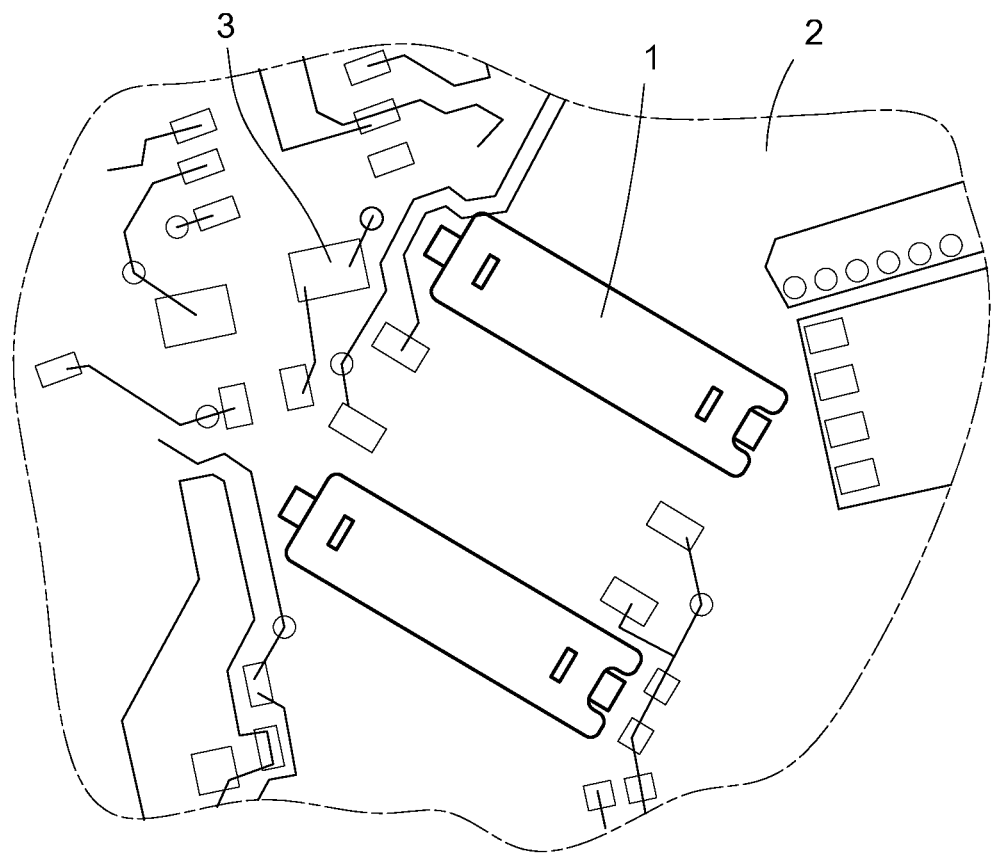
FIG. 3 is an application schematic view of the PCB pad for the SMT process in this disclosure.
Figure 4:
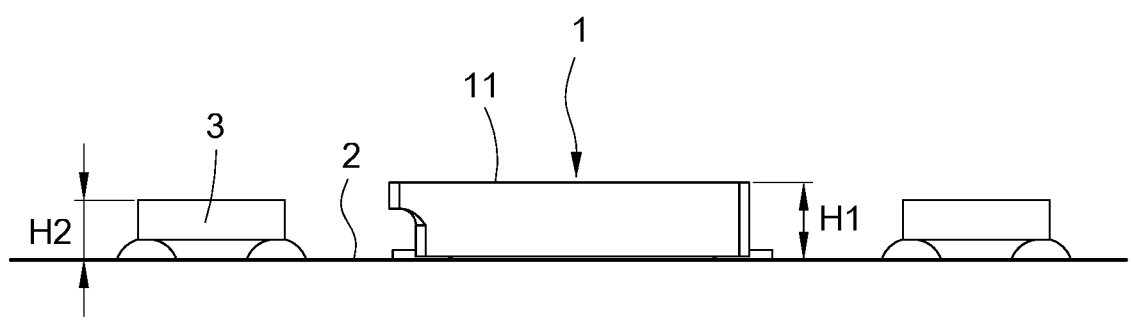
FIG. 4 is a side view of the PCB pad for the SMT process in this disclosure.

Please refer to FIG. 3 and FIG. 4, which depict an application schematic view and a side view of the PCB pad for the SMT process in this disclosure. The PCB pad 1 of this disclosure is combined on a PCB 2 for supporting at least one electronic component 3, such as an SMD component and the like, disposed thereon. In some embodiments, the PCB pads 1 may be attached to two sides of the electronic component 3, such as an SMD, component for supporting and to prevent the electronic component 3 from being damaged by an external pressure.

In more detail, the PCB pad 1 is fixed on the PCB 2. The insulation body 10 has a pick-up plane 11 on the side thereof away from the PCB 2. Furthermore, the automatic machine or the automatic arm may pick the PCB pad 1 by sucking the pick-up plane 11 to place the PCB pad 1 on the PCB 2.

Further, in some embodiments, the PCB pad 1 is disposed on the PCB 2 by placing the metal reflow portion 20 in a direction close to the PCB 2. Since the metal reflow portion 20 is not electrically connected with the PCB 2, the arrangement of the PCB pad 1 may not affect the electrical connection of the PCB 2.

Moreover, when the PCB 2 passes the soldering machine, the solder may be attached on the metal reflow portion 20 of the PCB pad 1 to solder the PCB pad 1 on the PCB 2.

As shown in FIG. 4, in some embodiments, the PCB pads 1 are attached to both sides of the electronic component 3. The PCB pad 1 of this disclosure has an overall height H1 (the overall height is defined as the height of the PCB pad from the PCB). Additionally, the electronic component 3 has an arranging height H2 (the arranging height is defined as the height of the electronic component from the PCB). The overall height H1 is greater than the arranging height H2. Accordingly, the PCB pad 1 may provide the supporting force to prevent the electronic component 3 from being damaged by an external pressure.

Figure 5:
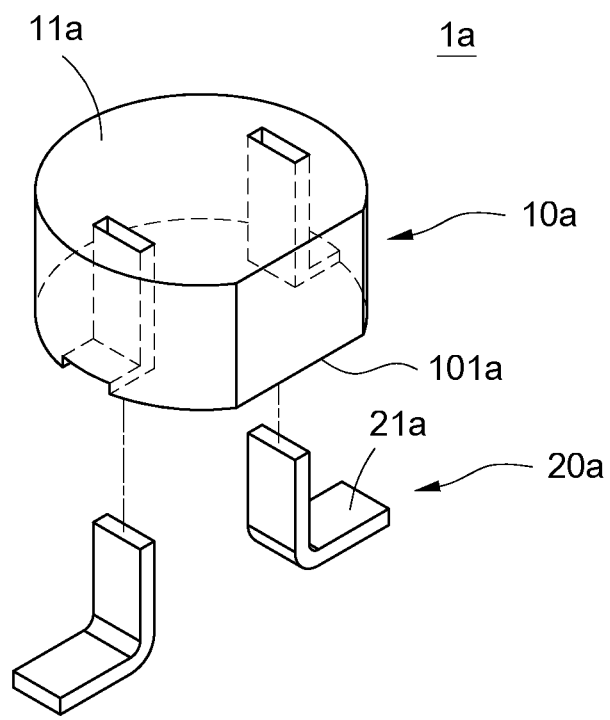
FIG. 5 is a perspective exploded schematic view of another embodiment of the PCB pad for the SMT process in this disclosure.
Figure 6:
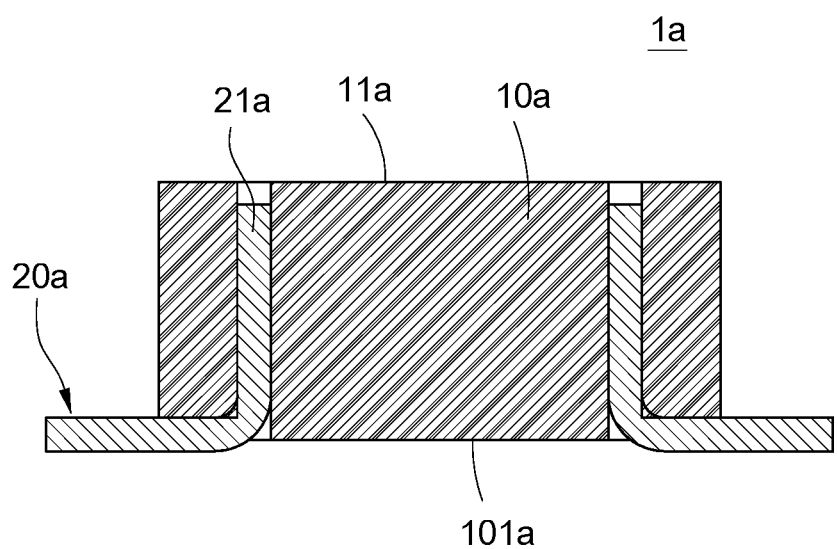
FIG. 6 is a cross-sectional view of another embodiment of the PCB pad for the SMT process in this disclosure.

Please further refer to FIG. 5 and FIG. 6, which depict a perspective exploded schematic view and a cross-sectional view of another embodiment of the PCB pad for the SMT process in this disclosure. In this embodiment, the PCB pad 1a includes an insulation body 10a and a metal reflow portion 20a disposed on the insulation body 10a. The insulation body 10a is a cylinder and has a pick-up plane 11a. The metal reflow portion 20a includes a pair of L-shaped metal pins 21a. The pair of L-shaped metal pins 21a are inserted in the insulation body 10a and exposed from the bottom 101a.

Figure 7:
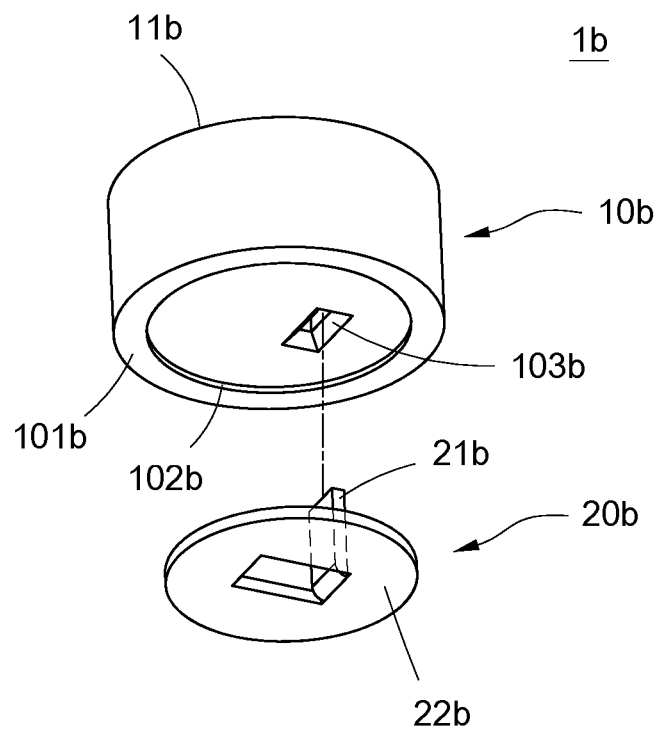
FIG. 7 is a perspective exploded schematic view of still another embodiment of the PCB pad for the SMT process in this disclosure.
Figure 8:
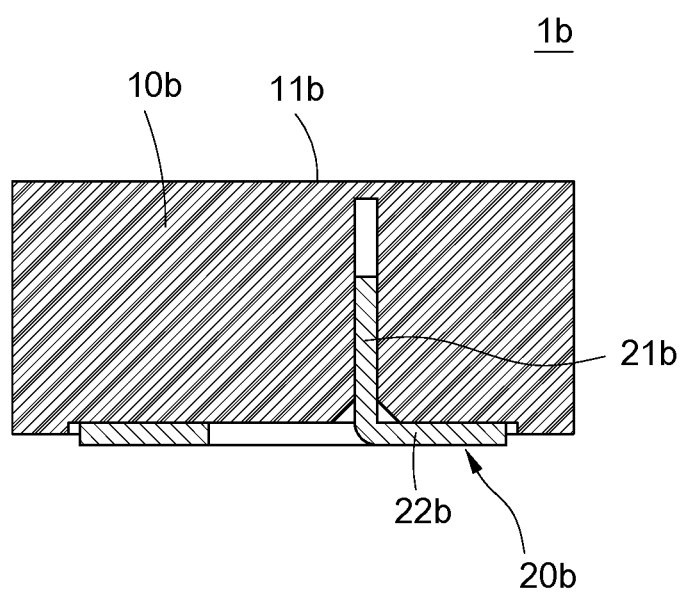
FIG. 8 is a cross-sectional view of still another embodiment of the PCB pad for the SMT process in this disclosure.

Please further refer to FIG. 7 and FIG. 8, which depict a perspective exploded schematic view and a cross-sectional view of still another embodiment of the PCB pad for the SMT process in this disclosure. In this embodiment, the PCB pad 1b includes an insulation body 10b and a metal reflow portion 20b disposed on the insulation body 10b. The insulation body 10b is a cylinder and has a pick-up plane 11b. The metal reflow portion 20b includes a metal pin 21b and a metal plate 22b connected to the metal pin 21b.

Specifically, the metal pin 21b is one piece formed with the metal plate 22b by punching the metal plate 22b. Additionally, a groove 102b and a slot 103b located in the groove 102b are disposed on the bottom 101b of the insulation body 10b. The metal plate 22b is attached in the groove 102b, and the metal pin 21b is inserted in the slot 103b and exposed from the bottom 101b.

Figure 9:
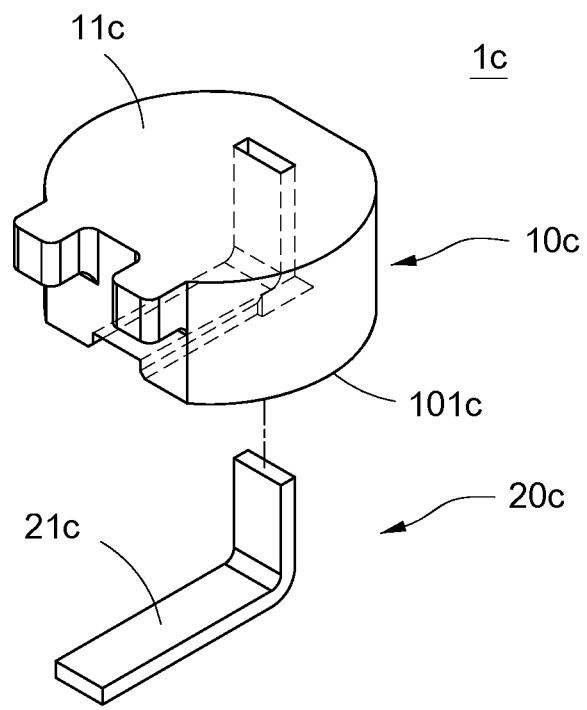
FIG. 9 is a perspective exploded view of another embodiment of the PCB pad for the SMT process in this disclosure.
Figure 10:
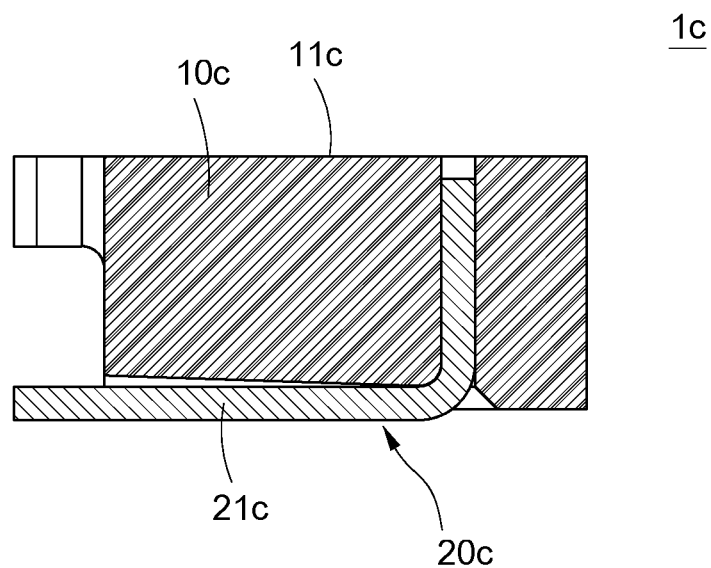
FIG. 10 is a cross-sectional view of another embodiment of the PCB pad for the SMT process in this disclosure.

Please further refer to FIG. 9 and FIG. 10, which depict a perspective exploded schematic view and a cross-sectional view of another embodiment of the PCB pad for the SMT process in this disclosure. In this embodiment, the PCB pad 1c includes an insulation body 10c and a metal reflow portion 20c disposed on the insulation body 10c. The insulation body 10c has a pick-up plane 11c. The metal reflow portion 20c is disposed on the bottom 101c of the insulation body 10c and includes a metal pin 21c disposed singly. The metal pins 21c is in an L shape.

Figure 11:
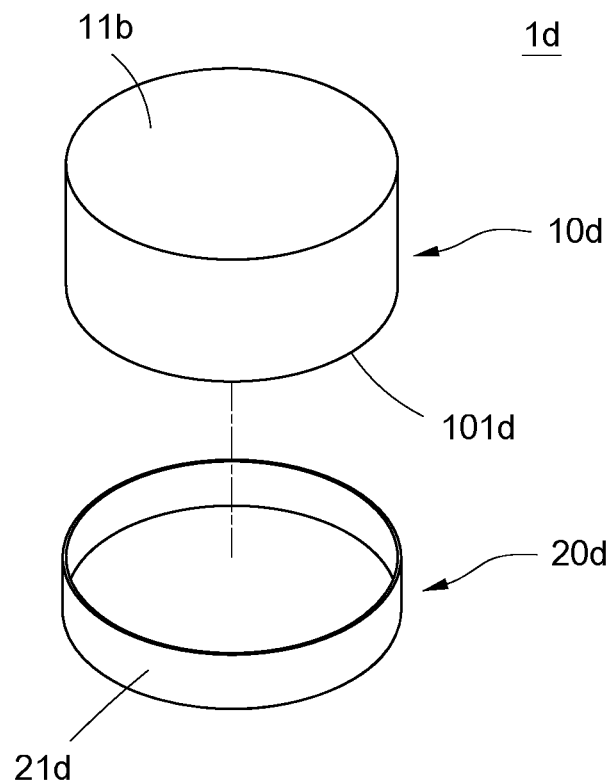
FIG. 11 is a perspective exploded view of still another embodiment of the PCB pad for the SMT process in this disclosure.
Figure 12:
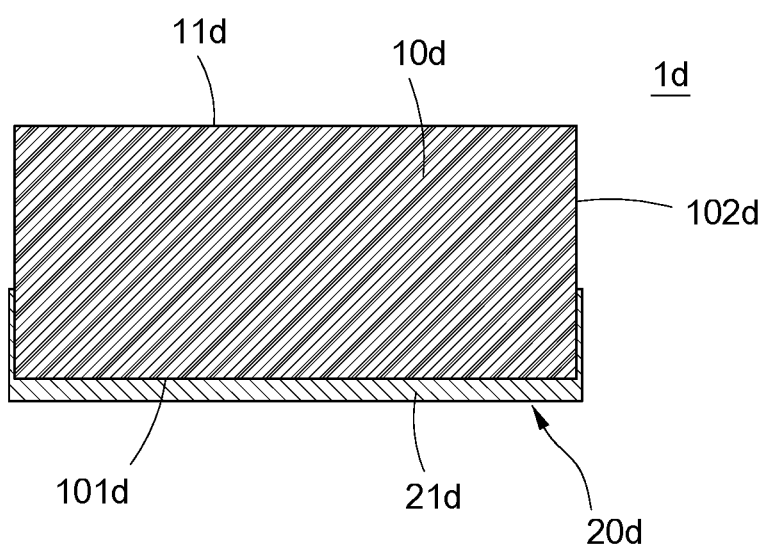
FIG. 12 is a cross-sectional view of still another embodiment of the PCB pad for the SMT process in this disclosure.

Please further refer to FIG. 11 and FIG. 12, which depict a perspective exploded schematic view and a cross-sectional view of still another embodiment of the PCB pad for the SMT process in this disclosure. In this embodiment, the PCB pad 1d includes an insulation body 10d and a metal reflow portion 20d disposed on the insulation body 10d. The insulation body 10d is a cylinder and has a pick-up plane 11d. The metal reflow portion 20d includes an electroplating layer 21d, and the electroplating layer 21d is disposed on the bottom 101d of the insulation body 10d and extended to the side periphery 102d of the insulation body 10d.

Figure 13:
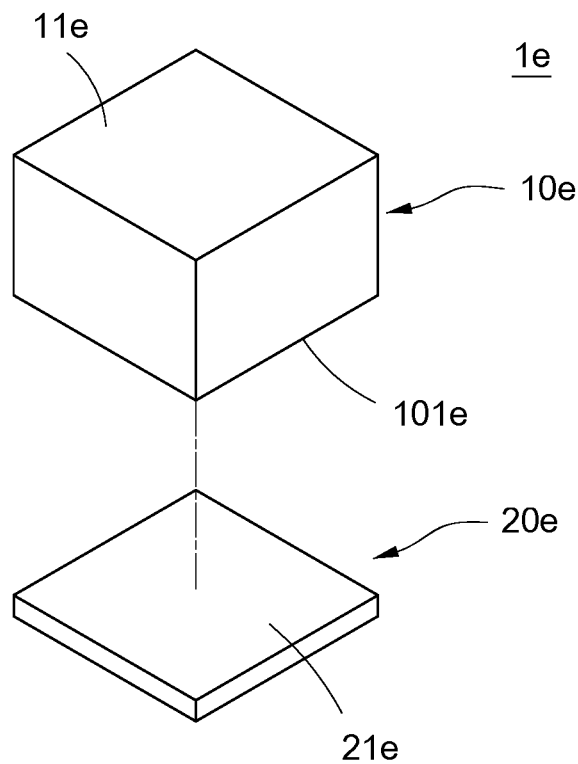
FIG. 13 is a perspective exploded view of another embodiment of the PCB pad for the SMT process in this disclosure.
Figure 14:
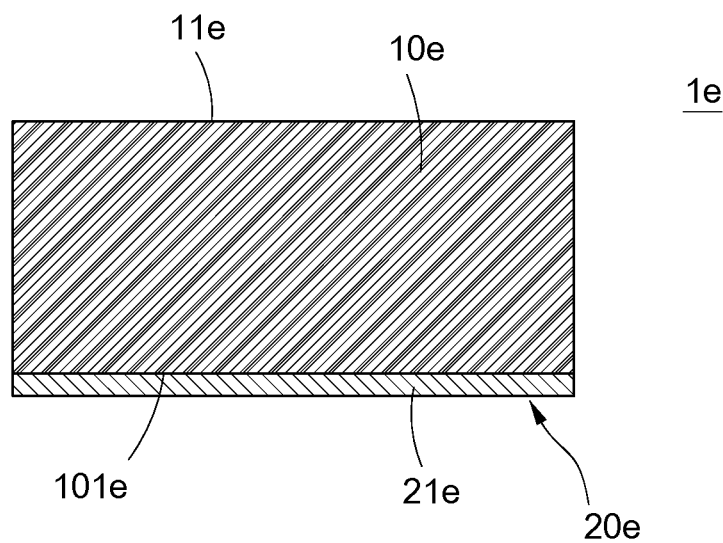
FIG. 14 is cross-sectional view of another embodiment of the PCB pad for the SMT process in this disclosure.

Please further refer to FIG. 13 and FIG. 14, which depict a perspective exploded schematic view and a cross-sectional view of another embodiment of the PCB pad for the SMT process in this disclosure. In this embodiment, the PCB pad 1e includes an insulation body 10e and a metal reflow portion 20e disposed on the insulation body 10e. The insulation body 10e is a cube and has a pick-up plane 11e. The metal reflow portion 20e includes an electroplating layer 21e, and the electroplating layer 21e is only disposed on the bottom 101e of the insulation body 10e.

While this disclosure has been described by means of specific embodiments, numerous modifications and variations could be made thereto by those skilled in the art without departing from the scope and spirit of this disclosure set forth in the claims.

What is claimed is:

1. A printed circuit board (PCB) pad for a surface mount technology (SMT) process, the PCB pad combined on a PCB, the PCB pad comprising:
   an insulation body; and
   a metal reflow portion, disposed on the insulation body, wherein the metal reflow portion is located on a side of the insulation body adjacent to the PCB, and the metal reflow portion is free from electrical connection with the PCB;
   wherein the metal reflow portion comprises an electroplating layer, and the electroplating layer is arranged on a bottom of the insulation body and extended to a side periphery of the insulation body;
   wherein the electroplating layer is configured to enclose the side periphery of the insulation body.

2. The PCB pad according to claim 1, wherein an electronic component is disposed on the PCB, and an overall height of the PCB pad is greater than an arranging height of the electronic component.

3. The PCB pad according to claim 1, wherein the insulation body comprises a pick-up plane on a side thereof away from the PCB.

4. A printed circuit board (PCB) pad for a surface mount technology (SMT) process, the PCB pad combined on a PCB, the PCB pad comprising:
   an insulation body; and
   a metal reflow portion, disposed on the insulation body, wherein the metal reflow portion is located on a side of the insulation body adjacent to the PCB, and the metal reflow portion is free from electrical connection with the PCB;
   wherein the metal reflow portion comprises a metal pin and a metal plate connected to the metal pin, and the metal pin is extended form an edge of an opening adjacent to a center of the metal plate through punching.

5. The PCB pad according to claim 4, wherein a groove and a slot located in the groove are disposed on a bottom of the insulation body; and the metal plate is attached in the groove, and the metal pin is inserted in the slot.

* * * * *